United States Patent
Hu et al.

(10) Patent No.: US 12,339,769 B2
(45) Date of Patent: Jun. 24, 2025

(54) MEMORY DEVICE, OPERATION METHOD THEREOF, AND MEMORY SYSTEM

(71) Applicant: YANGTZE MEMORY TECHNOLOGIES CO., LTD., Wuhan (CN)

(72) Inventors: Bailjun Hu, Wuhan (CN); Guangchang Ye, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/370,635

(22) Filed: Sep. 20, 2023

(65) Prior Publication Data

US 2024/0411685 A1    Dec. 12, 2024

Related U.S. Application Data

(63) Continuation of application No. PCT/CN2023/098946, filed on Jun. 7, 2023.

(51) Int. Cl.
*G06F 12/02* (2006.01)

(52) U.S. Cl.
CPC ................ *G06F 12/0246* (2013.01)

(58) Field of Classification Search
None
See application file for complete search history.

(56) References Cited

U.S. PATENT DOCUMENTS

| | | | |
|---|---|---|---|
| 2017/0032843 A1 | 2/2017 | Ilani et al. | |
| 2021/0264968 A1 | 8/2021 | Kim | |
| 2022/0108751 A1* | 4/2022 | Jeong | G06F 3/0629 |
| 2022/0179744 A1* | 6/2022 | Byun | G06F 11/1417 |
| 2022/0238170 A1 | 7/2022 | Kang et al. | |
| 2023/0137866 A1 | 5/2023 | Binfet et al. | |

FOREIGN PATENT DOCUMENTS

| | | |
|---|---|---|
| CN | 110175132 A | 8/2019 |
| CN | 111208938 A | 5/2020 |
| CN | 114003166 A | 2/2022 |
| CN | 114300021 A | 4/2022 |
| GB | 2016009342 | 7/2016 |

OTHER PUBLICATIONS

Supplementary European Search Report issued in corresponding European Application No. EP 23 92 5597.9, dated Mar. 18, 2025, 5 pages.

\* cited by examiner

*Primary Examiner* — Charles J Choi
(74) *Attorney, Agent, or Firm* — BAYES PLLC

(57) ABSTRACT

According to one aspect of the present disclosure, a memory device is provided. The memory device may include a memory cell array. The memory device may include a peripheral circuit coupled to the memory cell array. The peripheral circuit may be configured to receive a first instruction indicating to write dummy data at a specified location in the memory cell array. The peripheral circuit may be configured to generate the dummy data to be written in response to the first instruction. The peripheral circuit may be configured to write the dummy data to be written at the specified location.

20 Claims, 6 Drawing Sheets

---

Receiving a first instruction indicating to write dummy data at a specified location in a memory cell array of the memory device — S701

↓

Generating dummy data to be written in response to the first instruction — S702

↓

Writing the dummy data to be written at the specified location — S703

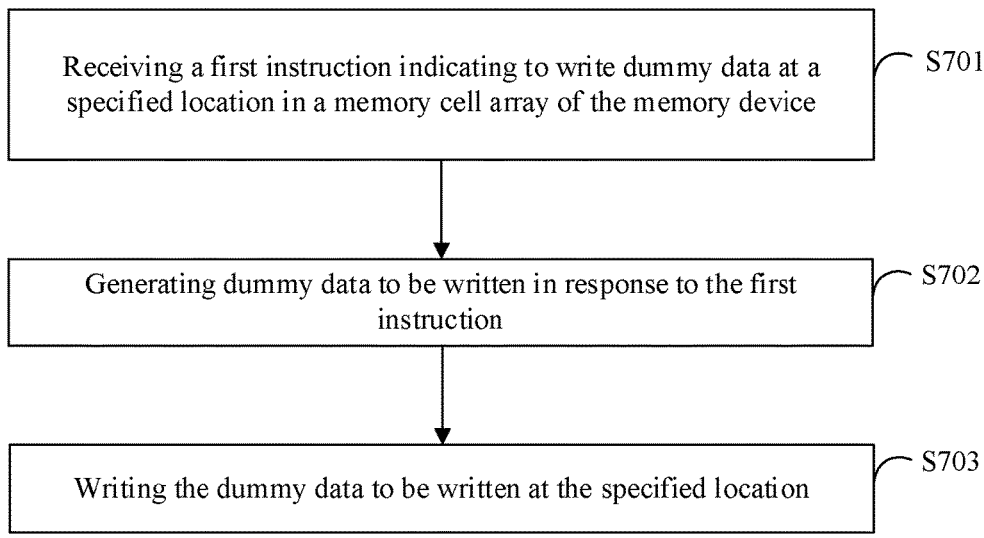
Fig. 7
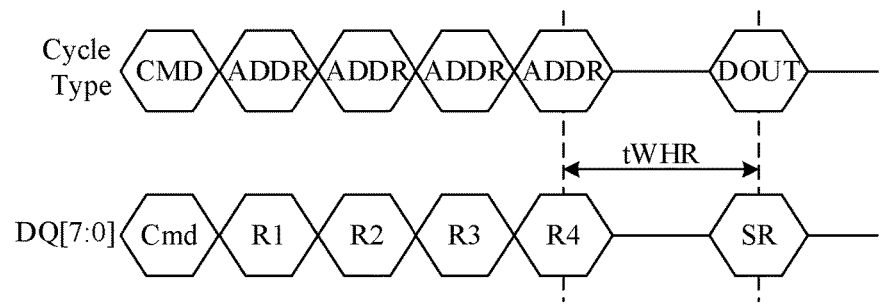
Fig. 8
| Cycle | DQ7 | DQ6 | DQ5 | DQ4 | DQ3 | DQ2 | DQ1 | DQ0 |
|---|---|---|---|---|---|---|---|---|
| First | CA7 | CA6 | CA5 | CA4 | CA3 | CA2 | CA1 | CA0 |
| Second | LOW | CA14 | CA13 | CA12 | CA11 | CA10 | CA9 | CA8 |
| Third | PA7 | PA6 | PA5 | PA4 | PA3 | PA2 | PA1 | PA0 |
| Fourth | BA3 | BA2 | BA1 | BA0 | PA11 | PA10 | PA9 | PA8 |
| Fifth | LOW | BA10 | BA9 | BA8 | BA7 | BA6 | BA5 | BA4 |
| Sixth | LOW | LOW | LOW | LOW | LOW | LA2 | LA1 | LA0 |
Fig. 9

MEMORY DEVICE, OPERATION METHOD THEREOF, AND MEMORY SYSTEM

CROSS-REFERENCE TO RELATED APPLICATIONS

This application is a continuation of International Application No. PCT/CN2023/098946, filed on Jun. 7, 2023, which is incorporated herein by reference in its entirety.

TECHNICAL FIELD

Examples of the present disclosure relate to the field of semiconductor technology, and in particular, to a memory device and an operation method thereof, and a memory system.

BACKGROUND

Memory devices and systems thereof serve as storage devices used to save information in modern information technologies. As a typical non-volatile semiconductor memory, Not-And (NAND) type memory has become a mainstream product in the market due to its higher storage density, controllable production cost, suitable programming and erasing speed and retention characteristics.

SUMMARY

According to one aspect of the present disclosure, a memory device is provided. The memory device may include a memory cell array. The memory device may include a peripheral circuit coupled to the memory cell array. The peripheral circuit may be configured to receive a first instruction indicating to write dummy data at a specified location in the memory cell array. The peripheral circuit may be configured to generate the dummy data to be written in response to the first instruction. The peripheral circuit may be configured to write the dummy data to be written at the specified location.

In some implementations, the first instruction may be configured by a set feature command. In some implementations, the first instruction may include a first flag set on a reserved field of a write command.

In some implementations, when the first instruction may be configured by the set feature command, a command in which the first instruction is located may not include the dummy data to be written. In some implementations, when the first instruction may include the first flag set on the reserved field of the write command. In some implementations, the peripheral circuit may be configured to, in response to the first instruction, not receive data information contained in the write command and directly generate the dummy data to be written.

In some implementations, the peripheral circuit may be configured to randomly generate the dummy data to be written. In some implementations, the peripheral circuit may be configured to generate the dummy data to be written according to data stored at a location adjacent to the specified location and in combination with a preset algorithm.

In some implementations, the preset algorithm may be related to a coupling effect between memory cells in the memory cell array.

In some implementations, the memory cell array may include a plurality of memory blocks. In some implementations, each of the memory blocks may include a plurality of valid memory pages and a plurality of dummy memory pages. In some implementations, the specified location may include one or more of at least one of the plurality of memory blocks, at least one of the valid memory pages in an erased state in one of the memory blocks, or at least one of the dummy memory pages in one of the memory blocks.

In some implementations, the specified location may include at least one of the valid memory pages in an erased state in one of the memory blocks. In some implementations, a memory page adjacent to the specified location may be in a programmed state.

In some implementations, the peripheral circuit may be further configured to receive a second instruction indicating to perform a read operation on data in the memory cell array. In some implementations, the peripheral circuit may be further configured to return the data to be read in response to the second instruction. In some implementations, when the data to be read includes the dummy data, a second flag may be set on a reserved field of a frame header of a returned data frame, and the second flag indicates that read data includes the dummy data.

In some implementations, the peripheral circuit may be further configured to, after writing the dummy data to be written at the specified location, save the specified location. In some implementations, the peripheral circuit may be further configured to, before returning the data to be read, check whether an address corresponding to the data to be read is within an address range corresponding to the specified location that is saved. In some implementations, the peripheral circuit may be further configured to, when the address corresponding to the data to be read is within the address range corresponding to the specified location that is saved, determine that the data to be read may include the dummy data.

According to another aspect of the present disclosure, a memory system, is provided. The memory system may include one or more memory devices as described in the foregoing examples of the present disclosure. The memory system may include a memory controller coupled to the memory device and configured to control the memory device.

In some implementations, the memory system may include a solid state disk.

In some implementations, the memory device may include a memory cell array and a peripheral circuit coupled to the memory cell array. In some implementations, the memory controller may be configured to send a first command. In some implementations, the first command may include a first instruction and a plurality of address instructions, and the first instruction may indicate to write a dummy data at a specified location corresponding to the plurality of address instructions. In some implementations, the peripheral circuit in the memory device may be configured to receive the first command. In some implementations, the peripheral circuit in the memory device may be configured to generate the dummy data to be written in response to the first command. In some implementations, the peripheral circuit in the memory device may be configured to write the dummy data to be written at the specified location corresponding to the plurality of address instructions.

In some implementations, the memory controller may be configured to send a second command. In some implementations, the second command may include a second instruction, and the second instruction may indicate to perform a read operation on data in the memory cell array. In some implementations, the peripheral circuit may be configured to receive the second instruction. In some implementations, the periphera circuit may be configured to return the data to be read in response to the second instruction. In some implementations, when the data to be read includes the dummy data, a second flag may be set on a reserved field of a frame header of a returned data frame, and the second flag may indicate that read data includes the dummy data.

In some implementations, the memory controller may be further configured to receive the data to be read that is returned. In some implementations, the memory controller may be configured to, when the returned data frame includes the second flag, stop receiving remaining data frames or not perform a decode operation on the data to be read that is returned.

In some implementations, the memory controller may be configured to send a second command. In some implementations, the second command may include a second instruction, and the second instruction may indicate to perform a read operation on data in the memory cell array.

In some implementations, the peripheral circuit may be configured to receive the second instruction. In some implementations, the peripheral circuit may be configured to return the data to be read in response to the second instruction. In some implementations, the data to be read may include the dummy data. In some implementations, the memory controller may be further configured to receive the data to be read that is returned. In some implementations, the memory controller discards the data to be read when decoding of the data to be read that is returned fails.

In some implementations, a method of operating a memory device is provided. The method may include receiving a first instruction indicating to write dummy data at a specified location in a memory cell array of the memory device. The method may include generating the dummy data to be written in response to the first instruction. The method may include writing the dummy data to be written at the specified location.

In some implementations, the first instruction may be configured by a set feature command. In some implementations, the first instruction may include a first flag set on a reserved field of a write command.

In some implementations, when the first instruction may be configured by the set feature command, a command in which the first instruction may be located does not include the dummy data to be written. In some implementations, the method may include, when the first instruction includes the first flag set on the reserved field of the write command, in response to the first instruction, not receiving data information contained in the write command and directly generating the dummy data to be written.

In some implementations, the generating the dummy data to be written may include randomly generating the dummy data to be written. In some implementations, the generating the dummy data to be written may include generating the dummy data to be written according to data stored at a location adjacent to the specified location and in combination with a preset algorithm.

In some implementations, the method may further include receiving a second instruction indicating to perform a read operation on data in the memory cell array. In some implementations, the method may further include returning the data to be read in response to the second instruction. In some implementations, when the data to be read includes the dummy data, a second flag is set on a reserved field of a frame header of a returned data frame, and the second flag indicates that read data includes the dummy data.

In some implementations, the method may further include, after writing the dummy data to be written at the specified location, saving the specified location. In some implementations, the method may further include, before returning the data to be read, checking whether an address corresponding to the data to be read is within an address range corresponding to the specified location that is saved. In some implementations, the method may further include, when the address corresponding to the data to be read is within the address range corresponding to the specified location that is saved, determining that the data to be read includes the dummy data.

Examples of the present disclosure propose a memory device, an operation method thereof, and a memory system. The method may include receiving a first instruction indicating to write dummy data at a specified location in a memory cell array of the memory device. The method may include generating the dummy data to be written in response to the first instruction. The method may include writing the dummy data to be written at the specified location. The memory device in the example of the present disclosure generates dummy data based on its own characteristics after receiving the dummy data filled at the specified location, and stores the dummy data at the specified location. In this way, the memory device generates dummy data according to its own characteristics, instead of the memory controller transmitting the dummy data to the memory device. In this way, the transmission time of the dummy data may be reduced, the time of filling the dummy data can be reduced, and the throughput of the memory system can be improved.

BRIEF DESCRIPTION OF THE DRAWINGS

FIG. 7 is a schematic flowchart of implementing an operation method of a memory device, according to some implementations of the present disclosure.

FIG. 8 is a schematic diagram of a write command when a memory device performs a write operation, according to some implementations of the present disclosure.

FIG. 9 is a schematic diagram of address information of a write command corresponding to a Trinary-Level Cell (TLC), according to some implementations of the present disclosure.

DETAILED DESCRIPTION

Figure 1:
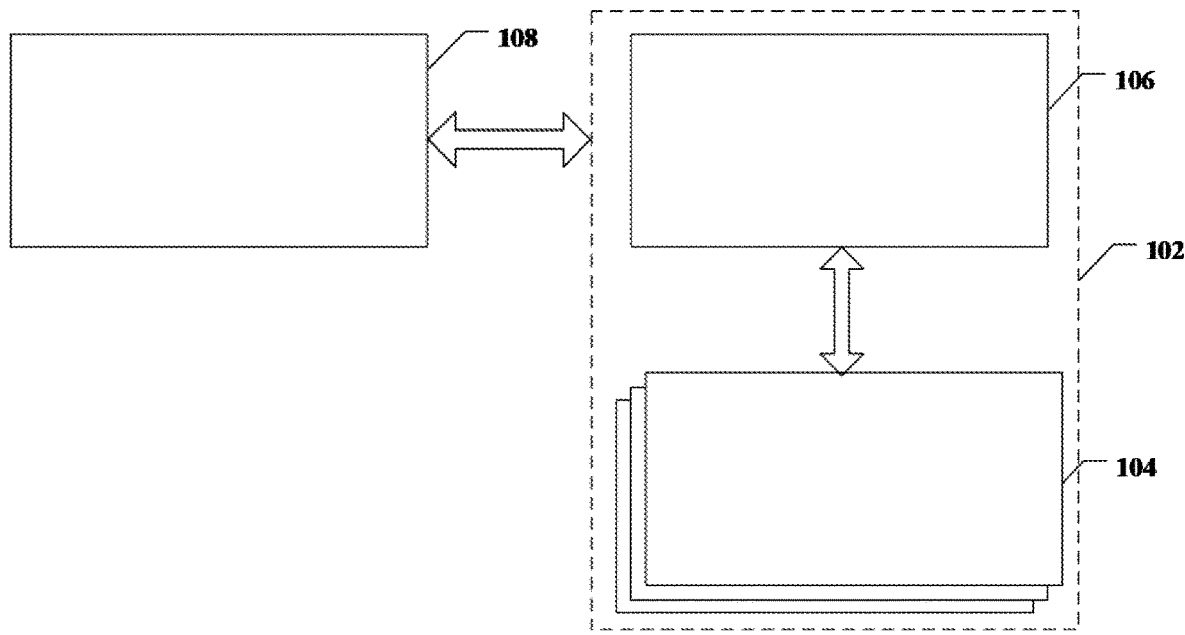
FIG. 1 is a schematic diagram of an example system with a memory system, according to some implementations of the present disclosure.

Examples of the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. Rather, these examples are provided so that the present disclosure can be more thoroughly understood, and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to" or "coupled to" another element or layer, it can be directly on, adjacent to, connected to, or coupled to other elements or layers, or intervening elements or layers may be present. In contrast, when an element is referred to as being "directly on," "directly adjacent to," "directly connected to" or "directly coupled to" another element or layer, there are no intervening elements or layers. It will be understood that, although the terms such as first, second, third etc. may be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present disclosure. When a second element, component, region, layer or section is discussed, it does not indicate that a first element, component, region, layer or section exists in the present disclosure.

Spatial terms such as "under", "below", "beneath", "underneath", "on", "above" and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present disclosure. As used herein, "a", "an" and "said/the" in singular forms are intended to include the plural forms as well, unless the context clearly dictates otherwise. It should also be understood that at least one of the terms "consists of" or "comprising", when used in this specification, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

For ease of understanding the characteristics and technical content of the examples of the present disclosure in more detail, the examples of the present disclosure will be described in detail below in conjunction with the accompanying drawings. The attached drawings are only for reference and description, and are not intended to limit the examples of the present disclosure.

The memory device in the examples of the present disclosure includes but is not limited to a three-dimensional NAND type memory, and for ease of understanding, a three-dimensional NAND type memory is used as an example for illustration.

FIG. 1 illustrates a block diagram of an example system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from the memory device 104.

Memory controller 106 is coupled to the memory device 104 and host 108 and is configured to control the memory device 104, according to some examples. Memory controller 106 can manage the data stored in memory device 104 and communicate with host 108. In some examples, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some examples, memory controller 106 is designed for operating in a high duty-cycle environment solid state disks (SSD) or embedded multi-media-cards (eMMCs) used as data storage for mobile devices, such as smartphones, tablets, laptop computers, etc., and enterprise storage arrays.

Memory controller 106 can be configured to control operations of the memory device 104, such as read, erase, and program operations. Memory controller 106 can also be configured to manage various functions with respect to the data stored or to be stored in the memory device 104 including, but not limited to bad-block management, garbage collection, logical-to-physical address conversion, wear leveling, etc. In some examples, memory controller 106 is further configured to process error correction codes (ECCs) with respect to the data read from or written to the memory device 104. Any other suitable functions may be performed by memory controller 106 as well, for example, formatting the memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
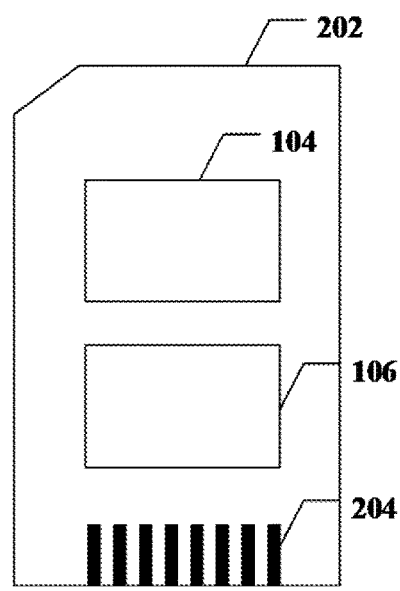
FIG. 2a is a schematic diagram of an example memory card with a memory system, according to some implementations of the present disclosure.
Figure 2B:
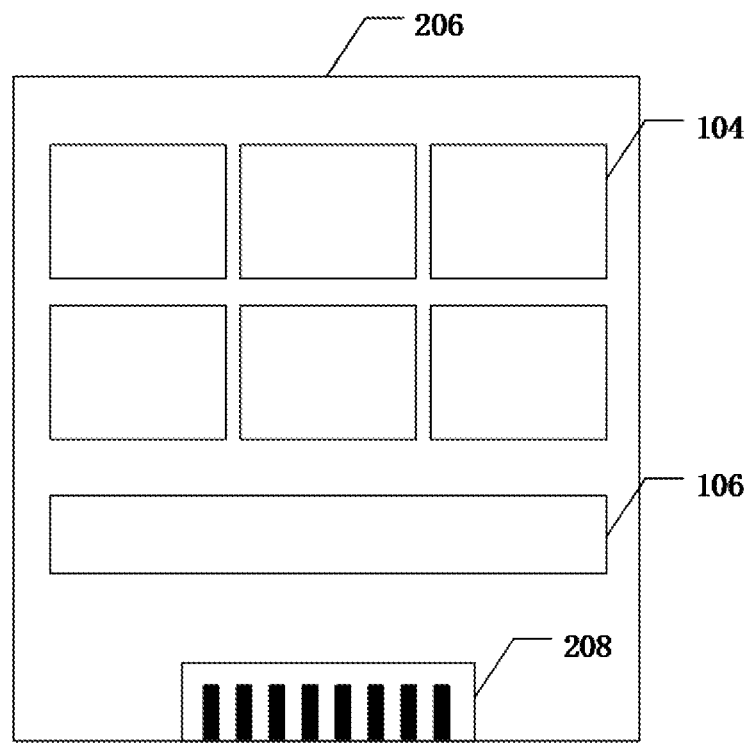
FIG. 2b is a schematic diagram of an example solid state drive with a memory system, according to some implementations of the present disclosure.

Memory controller 106 and one or more memory devices 104 can be integrated into various types of storage devices. For example, memory controller 106 and one or more memory devices 104 may be included in the same package, e.g., such as a universal Flash storage (UFS) package or an eMMC package. That is, memory system 102 can be implemented and packaged into different types of end electronic products. In one example, as shown in FIG. 2a, memory controller 106 and a single memory device 104 may be integrated into a memory card 202. Memory card 202 can include a PC card (personal computer memory card international association (PCMCIA)), a CF card, a smart media (SM) card, a memory stick, a multimedia card (MMC), Embedded MMC (eMMC), Reduced Size MMC (RS-MMC), Micro MMC, Secure Digital (SD) cards, Mini SD, Micro SD, Universal Serial Bus (USB) memory devices, Universal Flash Memory (UFS) devices, etc. Memory card 202 can further include a memory card connector 204 coupling memory card 202 with a host (e.g., host 108 in FIG. 1). In another example, as shown in FIG. 2b, memory controller 106 and multiple memory devices 104 may be integrated into an SSD 206. SSD 206 can further include an SSD connector 208 coupling SSD 206 with a host (e.g., host 108 in FIG. 1). In some examples, at least one of the storage capacity or the operation speed of SSD 206 is greater than those of memory card 202.

Figure 3A:
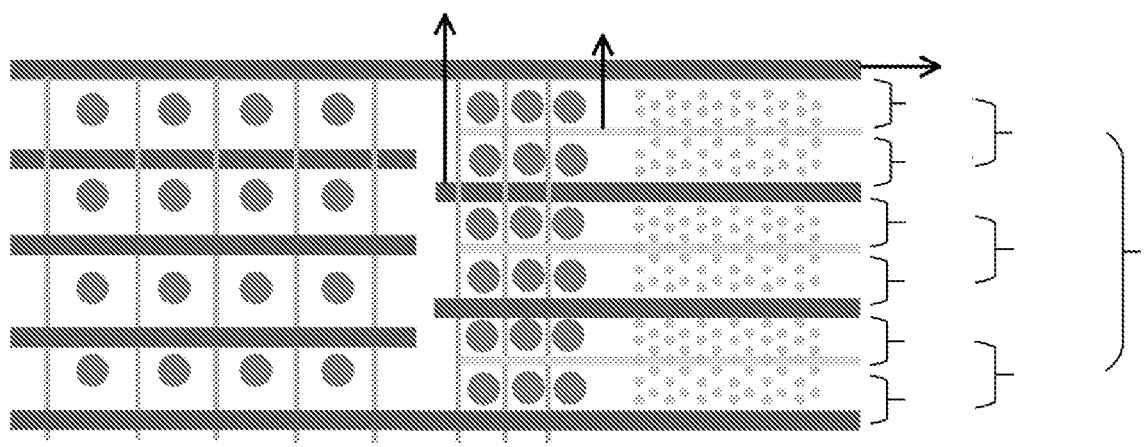
FIG. 3a is a schematic diagram of the distribution of memory cells of a three-dimensional NAND type memory, according to some implementations of the present disclosure.

FIG. 3a provides a structural schematic diagram of a memory cell array of a three-dimensional NAND type memory. As shown in FIG. 3a, the memory cell array of a three-dimensional NAND type memory may include several memory cell rows parallel to gate isolation structure and staggered in parallel. Every two rows of the memory cell rows are separated by a gate isolation structure and a top selective gate isolation structure, and each memory cell row includes a plurality of memory cells. The gate isolation structure may include a first gate isolation structure and a second gate isolation structure. The first gate isolation structure may divide the memory cell array into a plurality of memory blocks. The plurality of second gate isolation structures may divide the memory blocks into multiple memory fingers. The top selective gate isolation structure provided in the middle of each memory finger may divide the memory finger into two parts, so that the memory finger is divided into two slices. A memory block shown in FIG. 3a may include 6 slices, by way of example and not limitation.

In some examples, each memory block can be coupled to multiple word lines, and multiple memory cells coupled to each individually controlled word line form a memory page, and the page mentioned herein is a physical page. By way of example, all the memory cells coupled to one word line in each slice in FIG. 3a form a page.

It should be noted that the number of memory cell rows between the gate isolation structure and the top selective gate isolation structure shown in FIG. 3a is merely given as a non-limiting example, and is not used for limiting the number of memory cell rows contained in one memory finger of the three-dimensional NAND type memory in the present disclosure. In practical applications, the number of memory cell rows contained in one memory finger can be adjusted according to actual conditions, such as 2, 4, 8, 16, and so on.

Figure 3B:
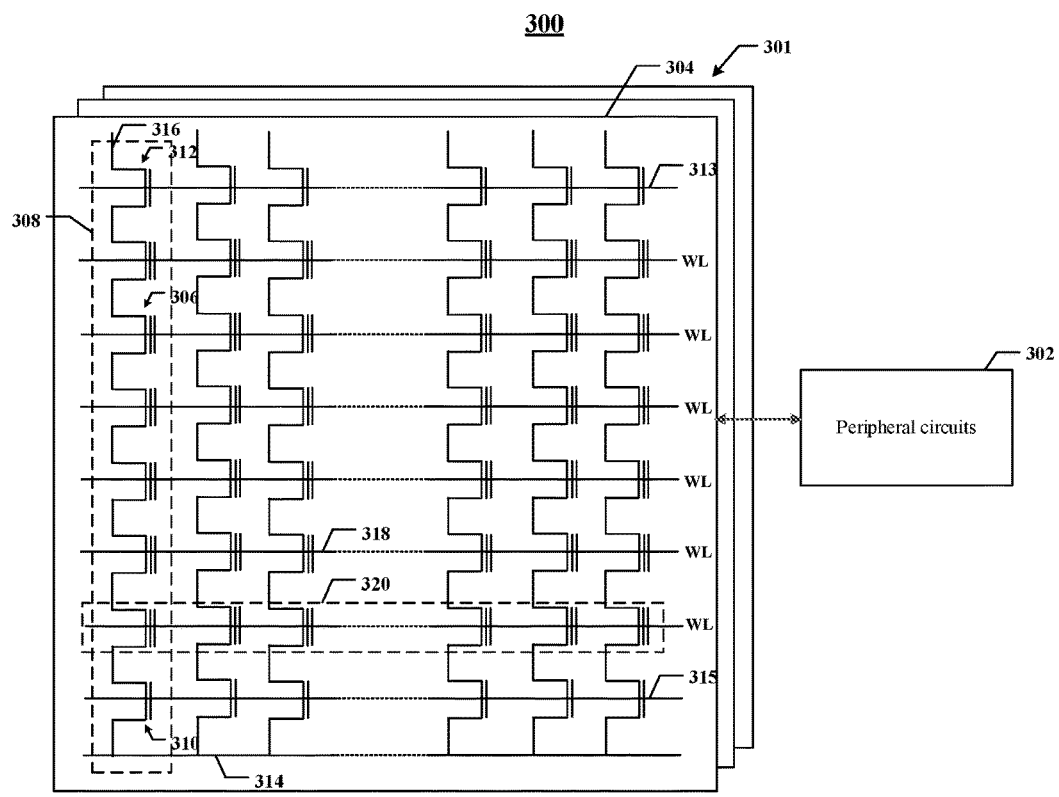
FIG. 3b is a schematic diagram of an example memory device including peripheral circuits, according to some implementations of the present disclosure.

FIG. 3b illustrates a schematic circuit diagram of an example memory device 300 including peripheral circuits, according to some aspects of the present disclosure. The memory device 300 can be an example of the memory device 104 in FIG. 1. The memory device 300 can include a memory cell array 301 and peripheral circuits 302 coupled to memory cell array 301. The memory cell array 301 is illustrated as an example of a three-dimensional NAND type memory cell array, in which memory cells 306 are NAND type memory cells and are provided in the form of an array of memory strings 308 each extending vertically above a substrate (not shown). In some examples, each memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some examples, each memory cell 306 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 306 is a multi-level cell (MLC) that is capable of storing more than a single bit of data in more than four memory states. For example, the MLC can store two bits per cell (also known as "Double-Level Cell"), three bits per cell (also known as "Trinary-Level Cell" (TLC)), four bits per cell (also known as a "Quad-Level Cell" (QLC)), five bits per cell (also known as a "Penta-Level Cell" (PLC)) or more than five bits per cell. Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3b, each memory string 308 can include a bottom selective transistor 310 (also referred to as a source side selective transistor, which includes a source selective gate BSG) at its source end and a top selective transistor 312 (also known as a drain side selective transistor, which includes a drain selective gate TSG) at its drain end. Source selective transistor BSG 310 and drain selective transistor TSG 312 can be configured to activate selected memory strings 308 during read and program operations. In some examples, the sources of memory strings 308 in a same memory block 304 are coupled through a same source line (SL) 314, e.g., a common SL. In other words, all memory strings 308 in the same memory block 304 have an array common source (ACS), according to some examples. TSG 312 of each memory string 308 is coupled to a respective bit line 316 from which data can be read or written via an output bus (not shown), according to some examples. In some examples, each memory string 308 is configured to be selected or deselected by at least one of: applying a select voltage (e.g., above the threshold voltage of the transistor having TSG 312) or a deselect voltage (e.g., 0 V) to respective TSG 312 through one or more TSG lines 313 or applying a select voltage (e.g., above the threshold voltage of the transistor having BSG 310) or a deselect voltage (e.g., 0 V) to respective BSG 310 through one or more BSG lines 315.

As shown in FIG. 3b, NAND memory strings 308 can be organized into multiple memory blocks 304, each of which can have a common source line 314, e.g., coupled to the ground. In some examples, each memory block 304 is the basic data unit for erase operations, e.g., all memory cells 306 on the same memory block 304 are erased at the same time. To erase memory cells 306 in a selected memory block 304, source lines 314 coupled to selected memory block 304 as well as unselected memory blocks 304 in the same plane as selected memory block 304 can be biased with an erase voltage (Vers), such as a high positive voltage (e.g., 20 V or more). It is understood that in some examples, erase operation may be performed at a half-memory block level, a quarter-memory block level, or a level having any suitable number of memory blocks or any suitable fractions of a memory block. Memory cells 306 of adjacent memory strings 308 can be coupled through word lines 318 that select which row of memory cells 306 is affected by read and program operations. In some examples, with reference to FIG. 3a above, the plurality of memory cells are isolated by the top selective gate isolation structure and the gate isolation structure. The multiple memory cells between the top selective gate isolation structure and the gate isolation structure are arranged into multiple memory cell rows, and each memory cell row is parallel to the gate isolation structure and the top selective gate isolation structure. Memory cells in slices that share a same word line form a physical page 320, and each physical page 320 can be mapped to at least one logical page based on the storage mode (e.g., SLC or MLC as mentioned above) of the corresponding memory cell 306. A logical page can constitute the basic data unit for program operations and read operations.

Referring to FIG. 3a and FIG. 3b, each memory cell 306 of the plurality of memory cells is coupled to respective word line 318s, and each memory string 308 is coupled to respective bit lines 316 via a respective selective transistor (such as top selective transistor (TSG) 312).

Figure 4:
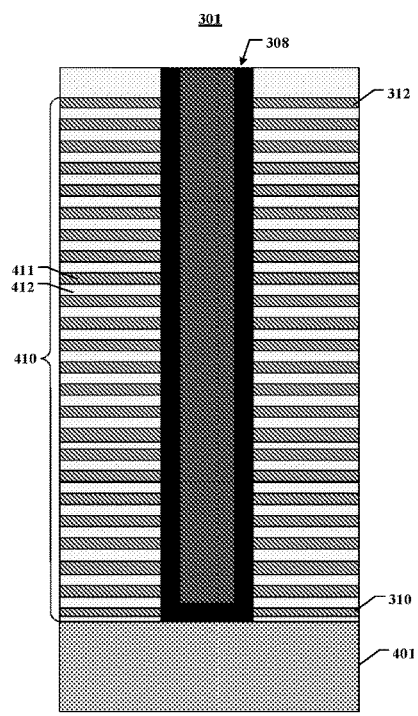
FIG. 4 is a schematic cross-sectional view of a memory cell array including a NAND type memory, according to some implementations of the present disclosure.

FIG. 4 shows a schematic cross-sectional view of an example memory cell array 301 including memory strings 308, exemplified by NAND, in accordance with aspects of the present disclosure. As shown in FIG. 4, the NAND memory cell array 301 may include a stacked structure 410, which includes a plurality of gate layers 411 and a plurality of insulating layers 412 alternately stacked in sequence, and a channel structure penetrating vertically through the gate layers 411 and the insulating layers 412. The channel structure is coupled with each gate layer to form a memory cell, and the channel structure is coupled with multiple gate layers in the stacked structure 410 to form a memory string 308. The gate layer 411 and the insulating layer 412 can be stacked alternately, and two adjacent gate layers 411 are separated by an insulating layer 412.

The constituent material of the gate layer 411 may include a conductive material. The conductive material may include, but is not limited to, e.g., tungsten (W), cobalt (Co), Copper (Cu), aluminum (Al), polysilicon, doped silicon, silicide, or any combination thereof. In some examples, each gate layer 411 may include a metal layer, e.g., a tungsten layer. In some examples, each gate layer 411 includes a doped polysilicon layer. Each gate layer 411 may include a control gate surrounding the memory cell. The gate layer 411 at the top of the stacked structure 410 may extend laterally as a top selective gate line, the gate layer 411 at the bottom of the stacked structure 410 may extend laterally as a bottom selective gate line, and the gate layer 411 extending laterally between the top selective gate line and the bottom selective gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, memory string 308 includes a channel structure extending vertically through the stacked structure 410. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
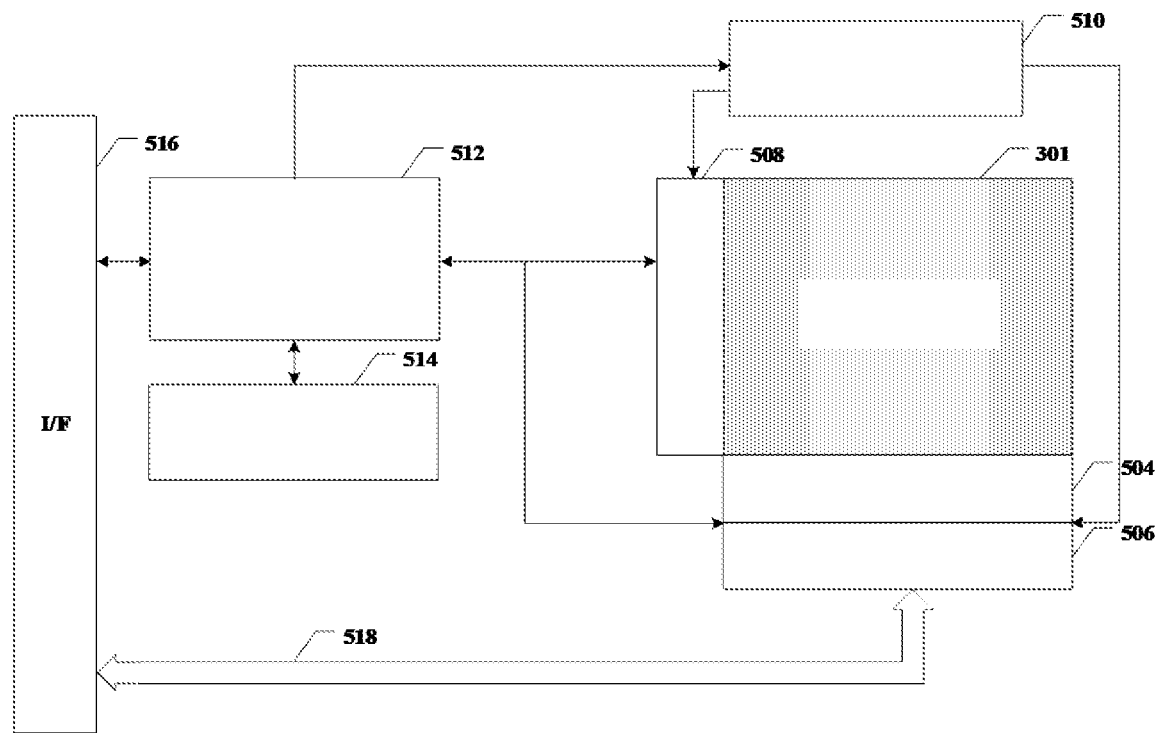
FIG. 5 is a schematic diagram of an example memory device including a memory cell array and peripheral circuits, according to some implementations of the present disclosure.

Referring back to FIG. 3b, peripheral circuits 302 can be coupled to memory cell array 301 through bit lines 316, word lines 318, source lines 314, BSG lines 315, and TSG lines 313. Peripheral circuits 302 can include any suitable analog, digital, and mixed-signal circuits for facilitating the operations of memory cell array 301 by applying and sensing at least one of voltage signals or current signals to and from each target memory cell 306 through bit lines 316, word lines 318, source lines 314, BSG lines 315, and TSG lines 313. Peripheral circuits 302 can include various types of peripheral circuits formed using metal-oxide-semiconductor (MOS) technologies. For example, FIG. 5 illustrates some example peripheral circuits, the peripheral circuits 302 including a page buffer/sense amplifier 504, a column decoder/bit line driver 506, a row decoder/word line driver 508, a voltage generator 510, control logic 512, registers 514, an OF interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store program data (write data) to be programmed into memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more memory strings 308 by applying bit line voltages generated from voltage generator 510.

Row decoder/word line driver 508 can be configured to be controlled by control logic 512 and select/deselect memory blocks 304 of memory cell array 301 and select/deselect word lines 318 of memory block 304. Row decoder/word line driver 508 can be further configured to drive word lines 318 using word line voltages generated from voltage generator 510. In some examples, row decoder/word line driver 508 can also select/deselect and drive BSG lines 315 and TSG lines 313 as well. As described below in detail, row decoder/word line driver 508 is configured to perform program operations on the memory cells 306 coupled to the selected word line(s) 318. Voltage generator 510 can be configured to be controlled by control logic 512 and generate the word line voltages (e.g., read voltage, program voltage, pass voltage, channel boost voltage, verification voltage, etc.), bit line voltages, and source line voltages to be supplied to memory cell array 301.

Control logic 512 may be coupled to the peripheral circuits described above and configured to control the operation of the peripheral circuits. Registers 514 can be coupled to control logic 512, and include status registers, command registers, and address registers for storing status information, command operation codes (OP codes), and command addresses for controlling the operations of each peripheral circuit. Interface 516 may be coupled to control logic 512 and act as a control buffer to buffer and relay control commands received from a host (not shown) to control logic 512, and to buffer and relay status information received from control logic 512 to the host. Interface 516 may further be coupled to column decoder/bit line driver 506 via data bus 518 and act as a data I/O interface and data buffer to buffer and relay data to or from memory cell array 301.

It should be understood that in the process of writing data, multiple operations are required, and both the performance of writing data and the correctness of data are important characteristics of the memory system. Therefore, high requirements are imposed on the process of writing data. In the existing process of writing data, some special processings may be conducted to ensure the stability of data. For example, the operation of filling the memory cell array with dummy data may be performed. The dummy data herein may be any random data. The dummy data is not intended for reading, but plays a specific role, such as alleviating the coupling effect of the memory page with data unwritten on the adjacent memory page with data written, so that the data retention in written memory cells is better.

The memory system may include a memory controller and a memory device. The memory device may include a memory cell array and peripheral circuits. The memory cell array may include a plurality of memory blocks, and each memory block includes a plurality of memory pages. In the process of writing data, part of the memory blocks in the memory device may be in a situation that the data is not fully written into them, and the physical characteristics of the memory system require that when the power is turned off (or shut down) or under certain conditions, an operation of filling dummy data need to be performed on the memory blocks that are not fully written to ensure the stability of written data. In some examples, the method of filling dummy data may include sending, by the memory controller, a special command to the memory device. The special command may indicate that some memory pages in the memory device are to be filled with dummy data. In some examples, the method of filling dummy data may include sending the corresponding dummy data to be written to the memory device. The method of filling the dummy data may include, after the memory device receiving the special command and the dummy data to be written, filling the received dummy data into the memory pages that need to be filled with dummy data. However, the above-mentioned process of filling dummy data is time consuming, and the content of the filled dummy data is data that may be of little interest to the user.

Figure 6:
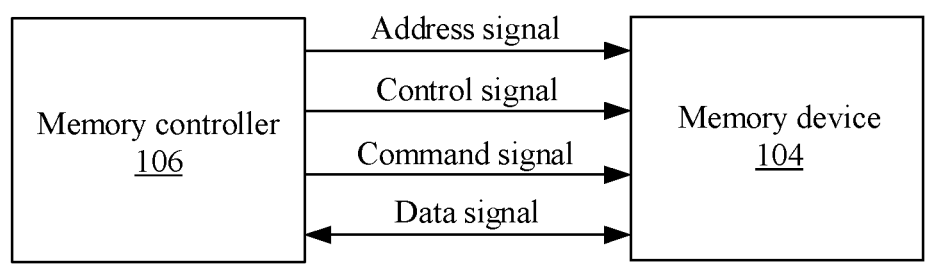
FIG. 6 is a schematic diagram of an example memory system including a memory controller and memory devices, according to some implementations of the present disclosure.

Based on one or more of the above problems, examples of the present disclosure propose a memory device, an operation method thereof, and a memory system. Referring to FIG. 1 and FIG. 6, the memory system 102 may include at least one memory device 104 and a memory controller 106 coupled to and configured to control the memory device. The memory controller 106 can access or control the memory device 104 according to certain timing rules. The memory controller 106 enables the host 108 (a device accessing the memory device) to use the storage resources on the memory device 104 according to its own requirements via address signals (e.g., address information/address instructions (ADDR)), data signals (e.g., data instructions (DATA)), control signal (e.g., control instructions (CTRL)) and various command signals (CMD). The memory device 104 herein may include, e.g., a memory cell array 301 and a peripheral circuit 302 coupled to the memory cell array 301. Referring to FIG. 7, the operation method of the memory device includes operations S701-S703.

For example, referring to FIG. 7, at operation S701, the method may include receiving a first instruction indicating to write dummy data at a specified location in the memory cell array 301.

At operation S702, the method may include generating the dummy data to be written in response to the first instruction.

At operation S703, the method writing the dummy data to be written at the specified location.

The memory cell array 301 may include a plurality of memory planes, each memory plane may include a plurality of memory blocks, and each memory block may include a plurality of memory pages. A memory page is the smallest unit for read and write (that is, program) operations, and a memory block is the smallest unit for erase operation. In some examples, each memory block may contain a plurality of valid memory pages and a plurality of dummy memory pages. It can be understood that the aforementioned memory pages are references to valid memory pages and dummy memory pages herein. The valid memory page is the memory page contained in the area corresponding to the word line (WL) or channel hole (CH), and is configured to store user data (actual data). A storage channel structure may be formed in the storage channel hole. The dummy memory page is the memory page included in the area corresponding to the dummy word line (DWL) or the dummy channel hole (DCH), and is configured for special functions, e.g., such as support, fault repair, bad block processing and the like, but not for storing actual data. Here, a dummy channel structure is formed in the dummy channel hole. The plurality of valid memory pages and the plurality of dummy memory pages can be arranged at intervals or adjacently. It should be understood that the plurality of valid memory pages and the plurality of dummy memory pages are all physical memory pages.

The peripheral circuit 302 may include at least one of any suitable digital, analog, or mixed-signal circuit configured to facilitate various operations of the memory device such as reading, writing, erasing, and the like. For example, the peripheral circuit may include control logic (such as a control circuit or controller), a data buffer, a decoder (a decoder may also be referred to as a coder), a driver, and a read and write circuit, etc. When the control logic receives a read and write operation command and address data, the decoder can apply the corresponding voltage from the driver to the corresponding bit lines and word lines based on the decoded address under the control logic, to realize the data reading and writing, and data interaction with the outside through the data buffer.

It should be noted that the subject of execution of operation S701 to operation S703 may include peripheral circuits. Referring to FIG. 5, in some examples, the OF interface 516 is used to receive the first instruction and transmit the first instruction to the control logic 512. The control logic 512 is used to generate dummy data according to the first instruction, and the page buffer/sense amplifier 504, the column decoder/bit line driver 506, the row decoder/word line driver 508, the voltage generator 510 and the control logic 512 are used to collectively perform writing of dummy data.

In operation S701, a first instruction is received.

In some examples, when there is memory block that is not fully filled in the memory cell array, the memory controller or the host sends a first instruction instructing to fill a specified location of the memory device with dummy data. Here, a first command may include the first instruction CMD and a plurality of address instructions ADDR. Here, the memory device 104 is used to receive the first instruction, and the first instruction CMD is used to indicate to write dummy data at a specified location in the memory cell array 301. For example, referring to FIG. 8, the plurality of address instructions ADDR include four-bit row addresses (R1, R2, R3, R4), which are the addresses of specified locations in the memory cell array 301. In some examples, the first instruction is configured by a set feature command; or the first instruction includes a first flag set on a reserved field of a write command.

In some examples, the first instruction is configured by the set feature command. Here, the premise is that the memory device supports the set feature command, and the set feature command can also be supported by the memory controller or the host. On this premise, the first instruction can be configured directly by the set feature command. The set feature command enables a user-defined protocol such as the first instruction to be directly edited to realize the communication about the first instruction between the memory device and the memory controller or the host. It should be noted that when the first instruction is configured by the set feature command, a command in which the first instruction is located does not include the dummy data to be written, and the command in which the first instruction is located may include a page program command, e.g., a dummy data write command and an address of the dummy data to be written. In an example, a first command of the dummy data write command in the ONFI protocol is a 81h command.

In some examples, the first instruction includes a first flag set on a reserved field of a write command. That is, in some examples, the first instruction may be embedded in a regular write command of the memory device. The regular write command may include a first part and a second part. The first part includes address instructions (address information), and the second part includes data information. In the example of the present disclosure, the first instruction includes the first flag set on the reserved field of the write command. That is, the first instruction is embedded on the reserved field of the write command (subsequently, this kind of write command will be referred to as a special write command for short). For example, FIG. 9 shows a schematic diagram of the address information of the write command corresponding to the Trinary-Level Cell (TLC). The write command includes 6 sets of address information (First, Second, Third, Fourth, Fifth, Sixth). The sixth set of address information (Sixth) is set with multiple reserved addresses (multiple LOWs shown in the dotted box in FIG. 9), and the reserved field of the write command may be any one of the multiple reserved addresses in the sixth set of address information (Sixth). In other words, any one of the multiple reserved addresses shown in the dotted box in FIG. 9 can be used to set the first flag.

When the first instruction includes the first flag set on the reserved field of the write command, the peripheral circuit does not receive data information contained in the write command and directly generates the dummy data to be written in response to the first instruction. Since the memory device does not receive the data information, the memory controller or the host may randomly generate invalid data information to meet the format requirements of the write command when generating a corresponding special write command. Moreover, when transmitting these special write commands, the memory controller or the host may transmit only address instructions without transmitting data information. In this way, the memory device end can only receive address information by the first instruction without receiving data information.

In some other examples, the first instruction may further be configured by a vendor command. Here, a vendor-unique command is a command that is not available to the general public, but is used only for an agreed-upon specific vendor, e.g., a manufacturer. The vendor-unique command is only available if the user is the agreed-upon vendor. When configured by a vendor command, it is necessary to update the protocol of the memory device end and the memory controller end. That is, make agreement on the protocol between the two parties again. Similarly, the command in which the first instruction is located does not need to contain the data information.

In some examples, the memory controller or the host does not generate the dummy data when sending the first instruction to instruct to write the dummy data at the specified location in the memory cell array.

Here, the specified location may include any location in the memory cell array of the memory device where no data is written. In some examples, the specified location includes one ore more of at least one of the plurality of memory blocks, at least one of the valid memory pages in an erased state in one of the memory blocks, and/or at least one of the dummy memory pages in one of the memory blocks.

In some examples, the specified location may include at least one of the plurality of memory blocks. When there is no data stored in certain one or more memory blocks of the memory cell array (that is, blank memory blocks) and some special test operations need to be performed, e.g., such as checking whether the programming and erasing counts are normal, checking the erasing time, etc. It may be necessary to write data into these memory blocks, but the written data itself is not the focus of attention. At this time, dummy data can be written into these memory blocks to achieve the purpose of quick test. In some examples, the specified location may include at least one of the valid memory pages in an erased state in one of the memory blocks, and a memory page adjacent to the specified location is in a programmed state. It can be understood that, when a part of the memory pages in a memory block is written with data, that is, a part of the memory pages is in the programmed state, and the remaining memory pages is not written with data, that is, another part of the memory pages is in the erased state. The level of the memory pages in the erased state is different from that of the memory pages in the programmed state, so that the electrons in the memory page in the programmed state adjacent to the memory page in the erased state are shifted, that is, an electronic coupling effect is generated. As a result, the retention of data in the memory pages in the programmed state is reduced. Based on this, when some memory pages in the memory block are written with data, dummy data can be stored in one or more memory pages without data written that are adjacent to the memory page with data written, so that the electronic coupling effect of the memory pages in the programmed state can be reduced.

In some examples, the specified location may include all remaining valid memory pages in the erased state in one of the memory blocks. It can be understood that a memory block is the smallest execution unit for an erase operation. In the process of performing an erase operation on a memory block, not only the memory pages in which data has been written in the erased memory block are erased, but also the valid memory pages without data written, e.g., in the erased state, in the memory block are erased. Consequently, the valid memory page in the erased state may be over-erased, thereby causing problems such as current leakage of the memory cell. At this time, writing dummy data into all remaining valid memory pages in the erased state in the memory block can reduce the probability of over-erasing and improve the performance of the memory device. In some examples, as mentioned above, the multiple memory pages in the memory block are divided into valid memory pages and dummy memory pages. The valid memory pages are memory pages configured for storing data, and the dummy memory pages are configured for special functions, e.g., such as support, fault repair, bad block processing, etc. It can be understood that when the dummy memory page is set adjacent to the valid data memory page, the aforementioned electronic coupling effect may also exist between the dummy memory page and the valid data memory page, and when there is no data stored in the dummy memory page, e.g., the dummy memory page is in the erased state, the aforementioned over-erasing problem also exists. In this case, storing the dummy data in the dummy memory page can reduce the electronic offset of the valid memory page adjacent to the dummy memory page and alleviate the over-erasing problem, thereby improving the performance of the memory device.

In operation S702, the memory device autonomously generates the dummy data to be written in response to the first instruction.

In some examples, generating the dummy data to be written may include, e.g., randomly generating the dummy data to be written; or generating the dummy data to be written according to data stored at a location adjacent to the specified location and in combination with a preset algorithm.

It is understood that the user does not care much about the content of the dummy data, and the dummy data does not need to be read and reused later. Based on this, the dummy data can be randomly generated by the memory device according to its own characteristics, or can be calculated according to its own actual demands.

In some examples, the randomly generated dummy data may all be "0", or may all be "1", or may be a random combination of "1s" and "0s".

In some other examples, in order to reduce the electronic coupling effect between adjacent memory pages, a set of dummy data can be calculated based on the data of the memory pages in the programmed state and in combination with a preset algorithm. Here, the adjacent memory pages may be memory pages in which data is written and adjacent memory pages in which data is not written. The preset algorithm is related to the coupling effect between memory cells in the memory cell array.

It can be understood that when the stored data corresponding to the memory cells of a certain memory page includes "1" or "0", the electrons are located in different layers of the channel structure. At this time, if the adjacent memory pages are in the erased state, the position of the electrons is fixed, and the electrons at the fixed position have different coupling effects on the adjacent electrons in different layers. At this time, the dummy data that minimizes the coupling effect can be derived from the data in the memory page where the data is written to obtain more accurate dummy data to be written, thereby reducing the electronic coupling effect between adjacent memory pages more accurately and improving the stability of data.

In operation S703, generated dummy data to be written is written at the specified location.

It should be noted that the generated dummy data to be written will also enter the page buffer first, and then be written from the page buffer into the memory cell at the specified location.

Based on this, after receiving the first instruction indicating to fill the dummy data at the specified location, the memory device in the above-mentioned examples of the present disclosure generates dummy data according to its own characteristics, and stores the dummy data at the specified location. In this way, on the one hand, the memory device generates dummy data according to its own characteristics, instead of the memory controller transmitting dummy data to the memory device. Accordingly, the transmission time of dummy data can be saved, the time of filling dummy data is reduced, and the throughput of the memory system is improved. On the other hand, storing the dummy data at the specified location enables the coupling effect between the memory pages with data written and the memory pages without data written in the memory device to be reduced, and the stability of written data to be improved.

In actual operations, it is necessary to perform a read operation on data in the memory cell array in some application scenarios. For example, after the memory device encounters an abnormal power failure, all data currently stored in the memory device will be read, and based on the reading results, a judgment is made and a data recovery strategy is determined after the abnormal power failure. The following will introduce how to deal with the situations where dummy data previously stored in the memory device is read in these scenarios.

In some examples, the method may include receiving a second instruction indicating to perform a read operation on data in the memory cell array. The method may include returning the data to be read in response to the second instruction. When the data to be read includes the dummy data, a second flag is set on a reserved field of a frame header of a returned data frame, and the second flag indicates that read data includes the dummy data.

Figure 10:
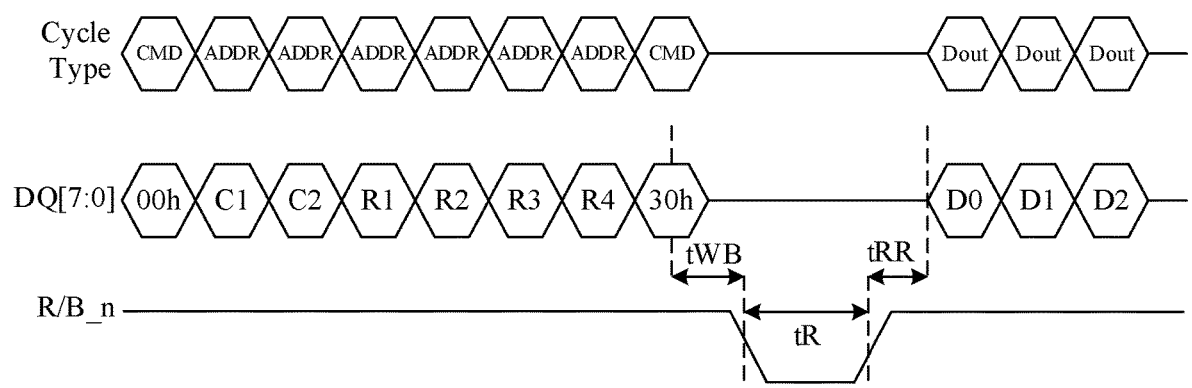
FIG. 10 is a schematic diagram of a read instruction when a memory device performs a read operation, according to some implementations of the present disclosure.

The second instruction received by the memory device is a read instruction, and the second instruction includes address information for performing a read operation. For example, referring to FIG. 10, the read instruction shown in FIG. 10 includes a data bus DQ[7:0], a read cycle type (Cycle Type) of the read operation, column address information (C1, C2), row address information (R1, R2, R3, R4), and amount of time to wait after sending the read instruction (tWB, tR, tRR), etc. The memory device reads the memory page corresponding to the column address information (C1, C2) and the row address information (R1, R2, R3, R4) according to the instruction of the second instruction, and after reading the data of the corresponding memory page, returns the read data back to the memory controller or host. The memory controller or the host can determine whether the read data includes dummy data according to the returned data.

In some examples, when the data to be read includes dummy data, the second flag is set on a reserved field of the frame header of the returned data frame. After receiving the returned data to be read, the memory controller or the host determines whether to decode the returned data to be read according to whether there is the second flag in the returned data frame. When there is the second flag in the returned data frame, it indicates that the returned data to be read includes dummy data. At this time, stop receiving remaining data frames or not perform a decode operation on the returned data to be read. When there is no second flag in the returned data frame, it indicates that the returned data to be read does not include dummy data. At this time, continue receiving remaining data frames and perform a decode operation on the returned data to be read.

It should be noted that there are two situations for the returned data. One is that there is no dummy data in the returned data (all of the data is actual data). At this time, the memory controller performs normal operation. The other is that there is dummy data in the returned data; and at this time, two methods can be used to distinguish the dummy data. The first one is that when the returned dummy data has a corresponding flag, such as the second flag mentioned above, the dummy data may be picked out by means of the flag. The second one is that when the returned dummy data does not have any flags, and at this time, considering that the dummy data is generated by the memory device according to its own characteristics, its address will not be stored in the logical-to-physical mapping table (LTP). At this time, the actual data can be picked out according to the logical-to-physical mapping table, and the remaining data is dummy data.

It should also be noted that when dummy data is written into the memory device, the dummy data is not encoded like normal data. Based on this, the writing duration of dummy data is shorter than that of normal valid data. However, when decoding the dummy data, there will be a decoding failure. Since that the user does not care about the dummy data, the dummy data can be discarded directly.

In some examples, the method may include, after writing the dummy data to be written at the specified location, saving the specified location. The method may include, before returning the data to be read, checking whether an address corresponding to the data to be read is within an address range corresponding to the specified location that is saved. The method may include, when the address corresponding to the data to be read is within the address range corresponding to the specified location that is saved, determining that the data to be read includes the dummy data.

That is to say, after writing the dummy data at the specified location in the memory cell array of the memory device, the memory device saves the address corresponding to the specified location. After reading the address of data to be read in the memory cell array according to the instruction of the second instruction, the memory device checks whether the address corresponding to the data to be read is within the address range corresponding to the specified location that is saved. If the address corresponding to the data to be read is within the address range corresponding to the specified location that is saved, it indicates that the data to be read includes dummy data. At this time, the second flag can be set on the reserved field of the frame header of the returned data frame. If the address corresponding to the data to be read is not within the address range corresponding to the specified location that is saved, it indicates that the data to be read does not include dummy data, and at this time, the second flag is not set on the reserved field of the frame header of the returned data frame. In this way, a basis can be provided for whether dummy data is included in the returned data.

On the other hand, an example of the present disclosure further provides a memory device. The memory device may include, e.g., a memory cell array, and a peripheral circuit coupled to the memory cell array. The peripheral circuit may be configured to receive a first instruction indicating to write dummy data at a specified location in the memory cell array. The peripheral circuit may be configured to generate the dummy data to be written in response to the first instruction. The peripheral circuit may be configured to write the dummy data to be written at the specified location.

In some examples, the first instruction may be configured by a set feature command; or the first instruction may include a first flag set on a reserved field of a write command.

In some examples, when the first instruction is configured by the set feature command, a command in which the first instruction is located does not include the dummy data to be written. In some examples, when the first instruction includes the first flag set on the reserved field of the write command, the peripheral circuit may be configured to, in response to the first instruction, not receive data information contained in the write command and directly generate the dummy data to be written.

In some examples, the peripheral circuit may be configured to randomly generate the dummy data to be written. In some examples, the peripheral circuit may be configured to generate the dummy data to be written according to data stored at a location adjacent to the specified location and in combination with a preset algorithm.

In some examples, the preset algorithm may be related to coupling effect between memory cells in the memory cell array.

In some examples, the memory cell array may include a plurality of memory blocks, each of the memory blocks may include a plurality of valid memory pages and a plurality of dummy memory pages. In some examples, the specified location may include one or more of at least one of the plurality of memory blocks, at least one of the valid memory pages in an erased state in one of the memory blocks, and at least one of the dummy memory pages in one of the memory blocks.

In some examples, the specified location may include at least one of the valid memory pages in an erased state in one of the memory blocks. In some examples, a memory page adjacent to the specified location may be in a programmed state.

In some examples, the peripheral circuit may be further configured to receive a second instruction indicating to perform a read operation on data in the memory cell array. In some examples, the peripheral circuit may be further configured to return the data to be read in response to the second instruction. In some examples, when the data to be read includes the dummy data, a second flag is set on a reserved field of a frame header of a returned data frame, and the second flag indicates that read data includes the dummy data.

In some examples, the peripheral circuit may be further configured to after writing the dummy data to be written at the specified location, save the specified location. In some examples, the peripheral circuit may be further configured to, before returning the data to be read, check whether an address corresponding to the data to be read is within an address range corresponding to the specified location that is saved. In some examples, the peripheral circuit may be further configured to, when the address corresponding to the data to be read is within the address range corresponding to the specified location that is saved, determine that the data to be read includes the dummy data.

In some examples, the memory device includes a NAND type memory.

It should be noted that the above hardware part and the regular working principle of the memory device can be understood corresponding to the above-mentioned FIGS. 3a to 5, and the above method of processing dummy data by the memory device can refer to that as described above with respect to the above-mentioned method of processing dummy data in the operation method of the memory device.

In yet another aspect, the examples of the present disclosure further disclose a memory system. The memory system includes one or more memory devices as described in the foregoing examples of the present disclosure. In some implementations, the memory system may include a memory controller coupled to and configured to control the memory device. The memory controller may be configured to control the memory device to perform read, write, and erase operations. Here, the memory controller and the memory device can be coupled in any suitable way. In the examples of the present disclosure, the memory device may be a semiconductor memory that stores data in a non-volatile manner, for example, a NAND type memory. The memory system is connected to a host, and the host may be an electronic device such as a personal computer and a mobile terminal.

In some examples, the memory system includes a universal flash storage (UFS) device or a solid state disk.

In yet another aspect, examples of the present disclosure further disclose a memory system. The memory system may include at least one memory device and a memory controller coupled to and configured to control the memory device. The memory device may include a memory cell array and a peripheral circuit coupled to the memory cell array. The memory controller may be configured to send a first command. The first command may include a first instruction and a plurality of address instructions, and the first instruction may indicate to write a dummy data at a specified location corresponding to the plurality of address instructions. The peripheral circuit in the memory device may be configured to receive the first command. The peripheral circuit in the memory device may be configured to generate the dummy data to be written in response to the first command. The peripheral circuit in the memory device may be configured to write the dummy data to be written at the specified location corresponding to the plurality of address instructions.

Here, in this example, the first command may be issued by the memory controller.

In some examples, the memory controller may be configured to send a second command. The second command may include a second instruction, and the second instruction indicating to perform a read operation on data in the memory cell array. In some examples, the peripheral circuit may be configured to receive the second instruction. In some examples, the peripheral circuit may be configured to return the data to be read in response to the second instruction. In some examples, when the data to be read includes the dummy data, a second flag may be set on a reserved field of a frame header of a returned data frame, and the second flag may indicate that read data includes the dummy data. In some examples, the memory controller may be further configured to receive the data to be read that is returned. In some examples, the memory controller may be further configured to, when the returned data frame includes the second flag, stop receiving remaining data frames or not perform a decode operation on the data to be read that is returned.

Here, in this example, the second command may be issued by the memory controller.

In some examples, the memory controller may be configured to send a second command. The second command may include a second instruction, and the second instruction indicating to perform a read operation on data in the memory cell array. In some examples, the peripheral circuit may be configured to receive the second instruction; and return the data to be read in response to the second instruction. In some examples, the data to be read may include the dummy data. In some examples, the memory controller may be further configured to receive the data to be read that is returned. In some examples, the memory controller may be further configured to discard the data to be read when decoding of the data to be read that is returned fails.

Examples of the present disclosure provide a storage medium, on which executable instructions are stored, and when the executable instructions are executed by a memory controller, the operations of any one of the methods described in the foregoing examples can be implemented.

In the examples of the present disclosure, the storage medium may be a NAND-type memory in the memory device, and executable instructions are stored in the NAND-type memory, where the executable instructions may be the firmware in the above examples. In this way, the memory controller can execute the executable instructions in the storage medium, so as to implement the operations in any one of the methods in the foregoing examples.

It should be understood that reference throughout the specification to "some examples" or "an example" means that a particular feature, structure or characteristic related to the example is included in at least one example of the present disclosure. Thus, appearances of "in some examples" or "in an example" in various places throughout the specification are not necessarily referring to the same example. Furthermore, these particular features, structures or characteristics may be combined in any suitable manner in one or more examples. It should be understood that in various examples of the present disclosure, the sequence numbers of the above-mentioned processes do not mean the order of execution, and the execution order of the processes should be determined by their functions and inherent logic, rather than limiting example process of the examples of the present disclosure. The serial numbers of the above-mentioned examples of the present disclosure are for description only, and do not represent the advantages and disadvantages of the examples.

The above is only a preferred example of the present disclosure, and does not limit the patent scope of the present disclosure. Under the inventive concept of the present disclosure, the equivalent structural transformation made by using the contents of the present disclosure and the accompanying drawings, or direct/indirect application in all other relevant technical fields, are included in the patent protection scope of the present disclosure.

What is claimed is:

1. A memory device, comprising:
   a memory cell array, and
   a peripheral circuit coupled to the memory cell array, wherein the peripheral circuit is configured to:
   receive a first instruction indicating to write dummy data at a specified location in the memory cell array;
   generate the dummy data to be written in response to the first instruction;
   write the dummy data to be written at the specified location;
   receive a second instruction indicating to perform a read operation on data in the memory cell array; and
   return the data to be read in response to the second instruction,
   wherein, when the data to be read comprises the dummy data, a second flag is set on a reserved field of a frame header of a returned data frame, and the second flag indicates that read data comprises the dummy data.

2. The memory device of claim 1, wherein:
   the first instruction is configured by a set feature command; or
   the first instruction comprises a first flag set on a reserved field of a write command.

3. The memory device of claim 2, wherein:
   when the first instruction is configured by the set feature command, a command in which the first instruction is located does not comprise the dummy data to be written, and
   when the first instruction comprises the first flag set on the reserved field of the write command, the peripheral circuit is configured to:
   in response to the first instruction, not receive data information contained in the write command and directly generate the dummy data to be written.

4. The memory device of claim 1, wherein the peripheral circuit is configured to:
   randomly generate the dummy data to be written; or
   generate the dummy data to be written according to data stored at a location adjacent to the specified location and in combination with a preset algorithm.

5. The memory device of claim 4, wherein the preset algorithm is related to coupling effect between memory cells in the memory cell array.

6. The memory device of claim 1, wherein:
   the memory cell array comprises a plurality of memory blocks, each of the memory blocks comprises a plurality of valid memory pages and a plurality of dummy memory pages, and
   the specified location comprises one or more of:
   at least one of the plurality of memory blocks;
   at least one of the valid memory pages in an erased state in one of the memory blocks; or
   at least one of the dummy memory pages in one of the memory blocks.

7. The memory device of claim 6, wherein:
   the specified location comprises at least one of the valid memory pages in an erased state in one of the memory blocks, and
   a memory page adjacent to the specified location is in a programmed state.

8. The memory device of claim 1, wherein the peripheral circuit is further configured to:
   after writing the dummy data to be written at the specified location, save the specified location;
   before returning the data to be read, check whether an address corresponding to the data to be read is within an address range corresponding to the specified location that is saved; and
   when the address corresponding to the data to be read is within the address range corresponding to the specified location that is saved, determine that the data to be read comprises the dummy data.

9. The memory device of claim 1, wherein the memory device comprises a three-dimensional NAND type memory.

10. The memory device of claim 1, wherein:
    when the data to be read does not comprise the dummy data, the second flag is not set on the reserved field of the frame header of the returned data frame.

11. A memory system, comprising:
    at least one memory device, comprising:
    a memory cell array, and
    a peripheral circuit coupled to the memory cell array, and
    a memory controller coupled to and configured to control the memory device, wherein the memory controller is configured to:
    send a first command, wherein the first command comprises a first instruction and a plurality of address instructions, and the first instruction indicates to write a dummy data at a specified location corresponding to the plurality of address instructions; and
    wherein the peripheral circuit in the memory device is configured to:
    receive the first command;
    generate the dummy data to be written in response to the first command; and
    write the dummy data to be written at the specified location corresponding to the plurality of address instructions,
    receive a second instruction indicating to perform a read operation on data in the memory cell array; and
    return the data to be read in response to the second instruction,
    wherein, when the data to be read comprises the dummy data, a second flag is set on a reserved field of a frame header of a returned data frame, and the second flag indicates that read data comprises the dummy data.

12. The memory system of claim 11, wherein:
    the memory controller is configured to:
    send a second command, wherein the second command comprising a second instruction, and the second instruction indicating to perform a read operation on data in the memory cell array;
    receive the data to be read that is returned; and when the returned data frame comprises the second flag, stop receiving remaining data frames or not perform a decode operation on the data to be read that is returned.

13. The memory system of claim 11, wherein:
the memory controller is configured to:
send a second command, wherein the second command comprising a second instruction, and the second instruction indicating to perform a read operation on data in the memory cell array;
the peripheral circuit is configured to:
receive the second instruction; and
return the data to be read in response to the second instruction, wherein the data to be read comprises the dummy data; and
the memory controller is further configured to:
receive the data to be read that is returned; and
discard the data to be read when decoding of the data to be read that is returned fails.

14. The memory system of claim 11, wherein the memory system comprises a solid state disk.

15. A method of operating a memory device, comprising:
receiving a first instruction indicating to write dummy data at a specified location in a memory cell array of the memory device;
generating the dummy data to be written in response to the first instruction;
writing the dummy data to be written at the specified location;
receiving a second instruction indicating to perform a read operation on data in the memory cell array; and
returning the data to be read in response to the second instruction,
wherein when the data to be read comprises the dummy data, a second flag is set on a reserved field of a frame header of a returned data frame, and the second flag indicates that read data comprises the dummy data.

16. The method of claim 15, wherein:
the first instruction is configured by a set feature command, or
the first instruction comprises a first flag set on a reserved field of a write command.

17. The method of claim 16, wherein:
when the first instruction is configured by the set feature command, a command in which the first instruction is located does not comprise the dummy data to be written, and
when the first instruction comprises the first flag set on the reserved field of the write command, in response to the first instruction, not receiving data information contained in the write command and directly generating the dummy data to be written.

18. The method of claim 17, wherein the generating the dummy data to be written comprises:
randomly generating the dummy data to be written; or
generating the dummy data to be written according to data stored at a location adjacent to the specified location and in combination with a preset algorithm.

19. The method of claim 15, further comprising:
after writing the dummy data to be written at the specified location, saving the specified location;
before returning the data to be read, checking whether an address corresponding to the data to be read is within an address range corresponding to the specified location that is saved; and
when the address corresponding to the data to be read is within the address range corresponding to the specified location that is saved, determining that the data to be read comprises the dummy data.

20. The method of claim 15, wherein:
when the data to be read does not comprise the dummy data, the second flag is not set on the reserved field of the frame header of the returned data frame.

* * * * *